United States Patent
Chiang et al.

(10) Patent No.: US 10,809,010 B2
(45) Date of Patent: Oct. 20, 2020

(54) MANUFACTURING METHOD OF HEAT DISSIPATION UNIT

(71) Applicant: ASIA VITAL COMPONENTS CO., LTD., New Taipei (TW)

(72) Inventors: Kuei-Feng Chiang, New Taipei (TW); Kuo-Chun Hsieh, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 65 days.

(21) Appl. No.: 16/221,595

(22) Filed: Dec. 17, 2018

(65) Prior Publication Data
US 2020/0191496 A1 Jun. 18, 2020

(51) Int. Cl.
| | |
|---|---|
| B21D 53/04 | (2006.01) |
| C23C 14/14 | (2006.01) |
| C23C 14/24 | (2006.01) |
| C23C 14/34 | (2006.01) |
| F28D 15/02 | (2006.01) |
| H05K 7/20 | (2006.01) |
| C23C 18/16 | (2006.01) |

(52) U.S. Cl.
CPC .......... F28D 15/0275 (2013.01); B21D 53/04 (2013.01); C23C 14/14 (2013.01); C23C 14/24 (2013.01); C23C 14/34 (2013.01); C23C 18/1633 (2013.01); F28D 15/0283 (2013.01); H05K 7/20336 (2013.01); H05K 7/20436 (2013.01)

(58) Field of Classification Search
CPC ............. F28D 15/0275; F28D 15/0283; C23C 18/1633; C23C 14/34; C23C 14/24; C23C 14/14; B21D 53/04; H05K 7/20436; H05K 7/20336
See application file for complete search history.

(56) References Cited

U.S. PATENT DOCUMENTS

| | | | |
|---|---|---|---|
| 7,007,741 B2 * | 3/2006 | Sen ................ | H01L 23/433 165/185 |
| 2012/0193081 A1 * | 8/2012 | Kao ................ | B22D 19/0072 165/177 |

FOREIGN PATENT DOCUMENTS

| | | |
|---|---|---|
| CN | 101203116 A | 6/2008 |
| CN | 104006689 A | 8/2014 |
| JP | 2004311519 A | 11/2004 |
| TW | I294957 | 3/2008 |

* cited by examiner

Primary Examiner — Lee A Holly
(74) Attorney, Agent, or Firm — Thomas J. Nikolai; DeWitt LLP

(57) ABSTRACT

A manufacturing method of heat dissipation unit includes steps of: providing a mold having an upper mold section and a lower mold section, the lower mold section being formed with a receiving depression and at least one sink; providing an upper plate, a lower plate, a capillary structure and at least one heat conduction member, the heat conduction member being positioned in the sink, the lower plate, the capillary structure and the upper plate being sequentially positioned in the receiving depression, then the heat conduction member, the lower plate, the capillary structure and the upper plate being thermally pressed and connected with each other by means of the upper and lower mold sections; and integrally connecting the heat conduction member with the lower plate when the upper and lower plates are thermally pressed and connected to form the plate body by means of the upper and lower mold sections.

25 Claims, 10 Drawing Sheets

```
┌──────────────────────────────────────────────────────┐
│ S1 │ providing a mold having an upper mold section and a lower
│    │ mold section, the lower mold section being formed with a
│    │ receiving depression, a bottom side of the receiving depression
│    │ being sunken to form at least one sink
└──────────────────────────────────────────────────────┘
                              │
                              ▼
┌──────────────────────────────────────────────────────┐
│ S2 │ providing an upper plate, a lower plate, a capillary
│    │ structure and at least one heat conduction member, the
│    │ at least one heat conduction member being positioned in
│    │ the at least one sink, the lower plate, the capillary
│    │ structure and the upper plate being sequentially
│    │ positioned in the receiving depression of the lower mold
│    │ section, then the at least one heat conduction member,
│    │ the lower plate, the capillary structure and the upper
│    │ plate being thermally pressed and connected with each
│    │ other by means of the upper and lower mold sections
└──────────────────────────────────────────────────────┘
                              │
                              ▼
┌──────────────────────────────────────────────────────┐
│ S3 │ integrally connecting the upper surface of the
│    │ at least one heat conduction member with the
│    │ outer surface of the lower plate of the plate
│    │ body when the upper and lower plates in the
│    │ lower mold section are thermally pressed and
│    │ connected with each other to form the plate
│    │ body by means of the upper and lower mold
│    │ sections
└──────────────────────────────────────────────────────┘
                              │
                              ▼
┌──────────────────────────────────────────────────────┐
│ S4 │ filling a working liquid into an opening of the
│    │ plate body and vacuuming the plate body and
│    │ sealing the opening of the plate body
└──────────────────────────────────────────────────────┘
```

Fig. 1

S1 — providing a mold having an upper mold section and a lower mold section, the lower mold section being formed with a receiving depression, a bottom side of the receiving depression being sunken to form at least one sink S2 — providing an upper plate, a lower plate, a capillary structure, at least one heat conduction member and at least one connection medium layer, the heat conduction member being positioned in the sink, the upper plate, the capillary structure and the lower plate formed with the connection medium layer being sequentially positioned in the receiving depression of the lower mold section, then the heat conduction member, the upper plate, the capillary structure and the lower plate formed with the connection medium layer being thermally pressed and connected with each other by means of the upper and lower mold sections S3 — integrally connecting the connection medium layer under the outer surface of the plate body with the upper surface of the heat conduction member when the upper and lower plates in the lower mold section are thermally pressed and connected with each other to form the plate body by means of the upper and lower mold sections S4 — filling a working liquid into an opening of the plate body and vacuuming the plate body and sealing the opening of the plate body

Fig. 4

S1 — providing a mold having an upper mold section and a lower mold section, the lower mold section being formed with a receiving depression, a bottom side of the receiving depression being sunken to form at least one sink S2 — providing an upper plate formed with a capillary structure on inner side, a lower plate formed with another capillary structure on inner side and at least one heat conduction member, the at least one heat conduction member being positioned in the at least one sink, the upper plate and the lower plate being sequentially positioned in the receiving depression of the lower mold section, then the heat conduction member, the upper plate and the lower plate being thermally pressed and connected with each other by means of the upper and lower mold sections S3 — integrally connecting the upper surface of the at least one heat conduction member with the outer surface of the lower plate of the plate body when the upper and lower plates in the lower mold section are thermally pressed and connected with each other to form the plate body by means of the upper and lower mold sections S4 — filling a working liquid into an opening of the plate body and vacuuming the plate body and sealing the opening of the plate body

Fig. 5

S1 — providing a mold having an upper mold section and a lower mold section, the lower mold section being formed with a receiving depression, a bottom side of the receiving depression being sunken to form at least one sink S2 — providing an upper plate formed with a capillary structure on inner side, a lower plate formed with another capillary structure on inner side, at least one heat conduction member and at least one connection medium layer, the at least one heat conduction member being positioned in the at least one sink, the upper plate and the lower plate formed with the connection medium layer being sequentially positioned in the receiving depression of the lower mold section, then the heat conduction member, the upper plate and the lower plate formed with the connection medium layer being thermally pressed and connected with each other by means of the upper and lower mold sections S3 — integrally connecting the connection medium layer under the outer surface of the plate body with the upper surface of the heat conduction member when the upper and lower plates in the lower mold section are thermally pressed and connected with each other to form the plate body by means of the upper and lower mold sections S4 — filling a working liquid into an opening of the plate body and vacuuming the plate body and sealing the opening of the plate body

Fig. 6

MANUFACTURING METHOD OF HEAT DISSIPATION UNIT

BACKGROUND OF THE INVENTION

1. Field of the Invention

The present invention relates generally to a manufacturing method of heat dissipation unit, and more particularly to a manufacturing method of heat dissipation unit, which can process the heat dissipation unit at one time to simplify the manufacturing process and achieve better heat dissipation effect.

2. Description of the Related Art

It is known that the operation performances of the current mobile devices, personal computers, servers, communication chassis and other systems or devices have become higher and higher. As a result, the heat generated by the internal heat generation components (such as, but not limited to chips) of these electronic devices has become higher and higher. Moreover, the current electronic equipments have more and more diversified functions and various heat generation components are arranged on the circuit boards of the current electronic equipments. A vapor chamber is used to face-to-face conduct heat by larger area. The vapor chamber is a rectangular or nonrectangular case (or plate body). A capillary structure is disposed on at least one inner wall face of the internal chamber of the case. In addition, a working fluid is filled in the chamber of the case. One face (heated face) of the case is attached to the heat generation component to absorb the heat generated by the heat generation component, whereby the liquid working fluid is evaporated into vapor working fluid and the heat is conducted to the other face (condensation face) of the case. The vapor working fluid is cooled and condensed into liquid working fluid. The liquid working fluid further flows back to the heated face due to gravity or capillary attraction of the capillary structure to continue the vapor-liquid circulation. Accordingly, the heat can be spread and dissipated. The vapor chamber has a larger contact area for conducting the heat. This is different from the heat pipe, which is used to point-to-point conduct heat. Therefore, the vapor chamber is applicable to a heat generation component with larger heat generation area or multiple heat generation components with shorter distance.

However, according to the design of the electronic circuit of the current circuit board, the height of the heat generation component the heat of which needs to be dissipated may be lower than that of the peripheral or adjacent electronic components such as a resistor, a capacitor or a passive component. Therefore, it is hard for the conventional heat dissipation component such as a heat sink, a heat pipe, a vapor chamber or a loop-type heat pipe to fully snugly attach to the heat generation component. This leads to the problems of poor heat conduction efficiency and poor heat dissipation effect.

SUMMARY OF THE INVENTION

It is therefore a primary object of the present invention to provide a manufacturing method of heat dissipation unit, which can effectively dissipate the heat of a heat generation component lower than the peripheral or adjacent electronic components or multiple heat generation components with different heights.

It is a further object of the present invention to provide the above manufacturing method of heat dissipation unit, which can process the heat dissipation unit at one time to simplify the manufacturing process.

It is still a further object of the present invention to provide the above manufacturing method of heat dissipation unit, which can lower the cost and increase the entire manufacturing speed.

To achieve the above and other objects, the manufacturing method of heat dissipation unit of the present invention includes steps of: providing a mold having an upper mold section and a lower mold section, the lower mold section being formed with a receiving depression, a bottom side of the receiving depression being sunken to form at least one sink; providing an upper plate, a lower plate, a capillary structure and at least one heat conduction member, the at least one heat conduction member being positioned in the at least one sink, the lower plate, the capillary structure and the upper plate being sequentially positioned in the receiving depression of the lower mold section, then the at least one heat conduction member, the lower plate, the capillary structure and the upper plate being thermally pressed and connected with each other by means of the upper and lower mold sections; and integrally connecting the upper surface of the at least one heat conduction member with the outer surface of the lower plate of the plate body when the upper and lower plates in the lower mold section are thermally pressed and connected with each other to form the plate body by means of the upper and lower mold sections.

Still to achieve the above and other objects, the manufacturing method of heat dissipation unit of the present invention includes steps of: providing a mold having an upper mold section and a lower mold section, the lower mold section being formed with a receiving depression, a bottom side of the receiving depression being sunken to form at least one sink; providing an upper plate, a lower plate, a capillary structure formed on inner side of at least one or both of the upper and lower plates and at least one heat conduction member, the at least one heat conduction member being positioned in the at least one sink, the lower plate and the upper plate being sequentially positioned in the receiving depression of the lower mold section, then the at least one heat conduction member, the lower plate and the upper plate being thermally pressed and connected with each other by means of the upper and lower mold sections; and integrally connecting the upper surface of the at least one heat conduction member with the outer surface of the lower plate of the plate body when the upper and lower plates in the lower mold section are thermally pressed and connected with each other to form the plate body by means of the upper and lower mold sections.

According to the design of the manufacturing method of heat dissipation unit of the present invention, the heat dissipation unit can be processed at one time. Therefore, the manufacturing process is simplified and the manufacturing cost is effectively lowered. Also, the entire manufacturing speed is increased.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein:

FIG. 1 is a flow chart of a first embodiment of the present invention;

FIG. 4 is a flow chart of a second embodiment of the present invention;

FIG. 5 is a flow chart of a third embodiment of the present invention;

FIG. 6 is a flow chart of a fourth embodiment of the present invention; and

DETAILED DESCRIPTION OF THE PREFERRED EMBODIMENTS

Figure 1A:
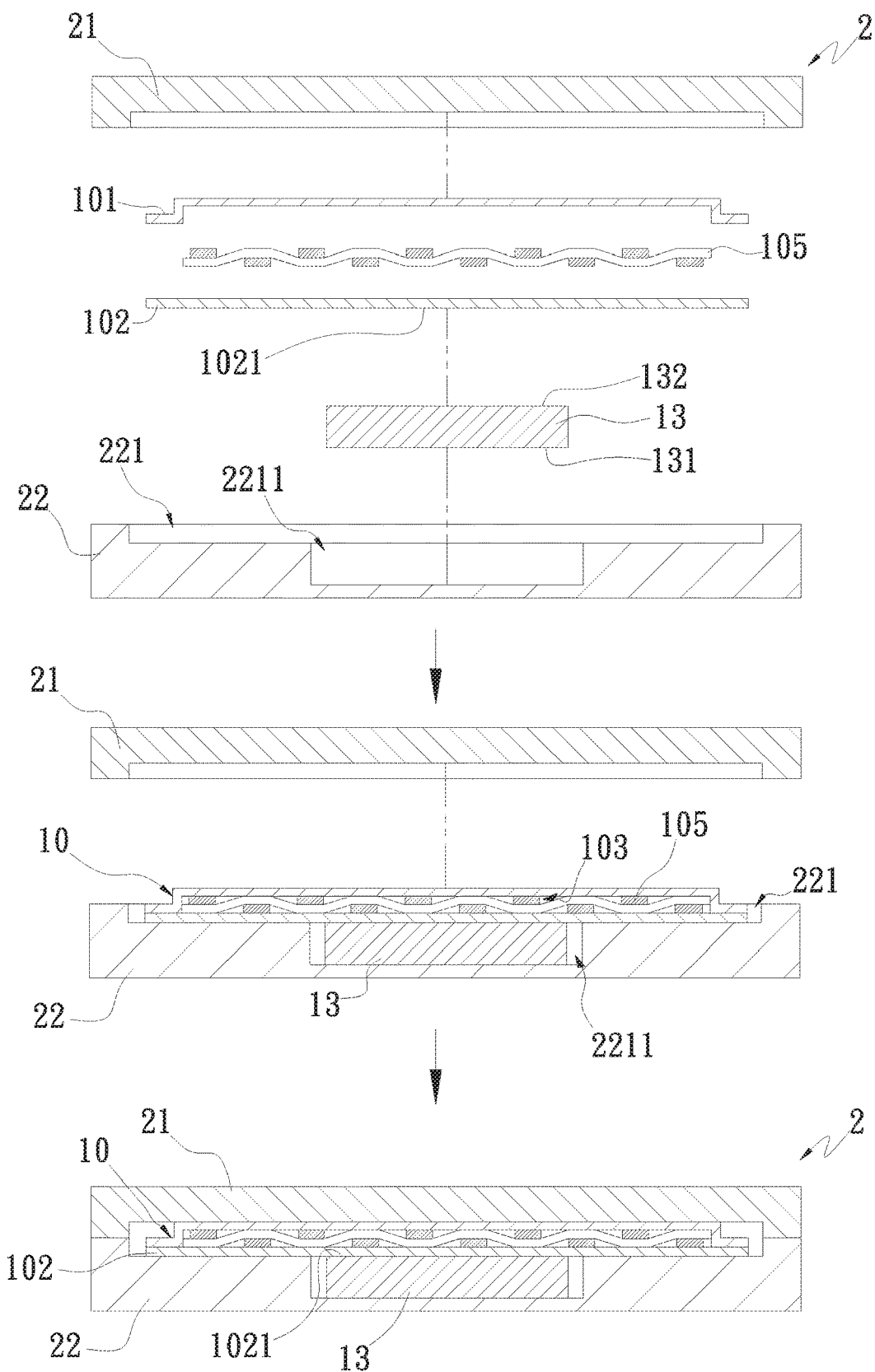
FIG. 1A is a sectional view showing the first embodiment of the manufacturing method of heat dissipation unit of the present invention.
Figure 2:
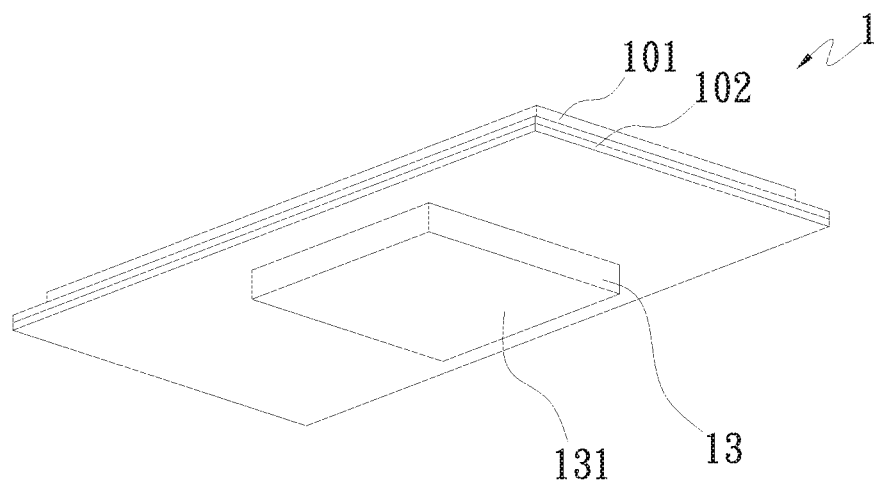
FIG. 2 is a perspective view of the heat dissipation unit of the present invention.
Figure 3:
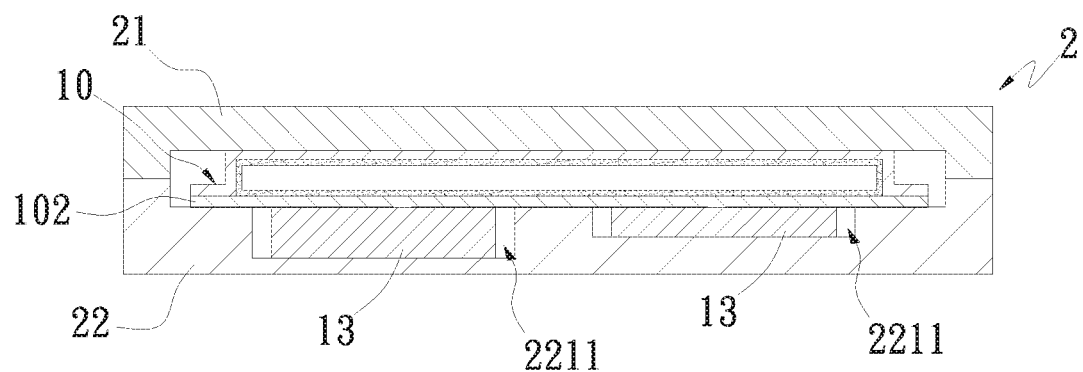
FIG. 3 is a sectional view showing that the upper and lower plates of the heat dissipation unit of the present invention are thermally pressed and connected with each other by means of the upper and lower mold sections and the capillary structure is disposed on inner sides of the upper and lower plates.

Please refer to FIGS. 1 to 3. FIG. 1 is a flow chart of a first embodiment of the present invention. FIG. 1A is a sectional view showing the first embodiment of the manufacturing method of heat dissipation unit of the present invention. FIG. 2 is a perspective view of the heat dissipation unit of the present invention. FIG. 3 is a sectional view showing that the upper and lower plates of the heat dissipation unit of the present invention are thermally pressed and connected with each other by means of the upper and lower mold sections and the capillary structure is disposed on inner walls of the upper and lower plates. In the first embodiment of the manufacturing method of heat dissipation unit of the present invention, the heat dissipation unit 1 is composed of a plate body 10 and at least one heat conduction member 13. The plate body 10 and the heat conduction member 13 are made of the same material and integrally connected with each other to form the heat dissipation unit 1. According to the first embodiment, the manufacturing method of heat dissipation unit of the present invention includes steps of:

S1. providing a mold having an upper mold section and a lower mold section, the lower mold section being formed with a receiving depression, a bottom side of the receiving depression being sunken to form at least one sink, a mold 2 being provided, in this embodiment, the mold 2 being a graphite mold 2, the mold 2 having an upper mold section 21 and a lower mold section 22 corresponding to the upper mold section 21, the lower mold section 22 being formed with a receiving depression 221, an upper side of the lower mold section 22 being recessed to form the receiving depression 221, the receiving depression 221 having at least one sink 2211, a bottom side of the receiving depression 221 being sunken toward the lower side of the lower mold section 22 to form the sink 2211, in this embodiment, there being one sink 2211 for receiving the heat conduction member 13, in practice, the number of the sink 2211 being equal to the number of the heat conduction member 13;

S2. providing an upper plate, a lower plate, a capillary structure and at least one heat conduction member, the at least one heat conduction member being positioned in the at least one sink, the lower plate, the capillary structure and the upper plate being sequentially positioned in the receiving depression of the lower mold section, then the at least one heat conduction member, the lower plate, the capillary structure and the upper plate being thermally pressed and connected with each other by means of the upper and lower mold sections, an upper plate 101, a lower plate 102, a capillary structure 105 and at least one heat conduction member 13 being provided, the heat conduction member 13 being first placed into the sink 2211 of the lower mold section 22, then the lower plate 102, the capillary structure 105 and the upper plate 101 being sequentially placed into the receiving depression 221, an outer surface of the lower plate 102 in the lower mold section 22 facing an upper surface of the heat conduction member 13, (that is, a heat conduction face 132 of the heat conduction member 13), the lower plate 102 being positioned on upper side of the heat conduction member 13, the capillary structure 105 being positioned between the upper and lower plates 101, 102, then the heat conduction member 13, the lower plate 102, the capillary structure 105 and the upper plate 101 being thermally pressed and connected with each other by means of the upper and lower mold sections 21, 22, the capillary structure 105 being a woven mesh or a fiber body, in this embodiment, the capillary structure 105 being a woven mesh, while the heat conduction member 13 being a solid heat conduction block, the heat conduction member 13 being previously designed in accordance with the height of a heat generation component (not shown), which is lower than the heights of the peripheral or adjacent electronic components, whereby the total height (or thickness) of the heat conduction member 13 can be adjusted so that the heat conduction member 13 can directly attach to and contact the corresponding heat generation component to achieve better heat conduction and dissipation effect, the upper and lower plates 101, 102 and the heat conduction member 13 being made of the same material, the same metal material being the same metal material (such as copper, aluminum, stainless steel or titanium) or the same ceramic material (such as silicon nitride ($Si_3N_4$), Zirconia ($ZrO_2$) or alumina ($Al_2O_3$)), in this embodiment, the upper and lower plates 101, 102 (the plate body 10) being made of copper and the heat conduction member 13 being also made of copper for illustration purposes, the heat conduction member 13 having a heat absorption face 131 and the heat conduction face 132, in this embodiment, the heat conduction face 132 of the heat conduction member 13 being an upper surface, while the heat absorption face 131 being a lower surface, in this embodiment, the heat absorption face 131 (the lower surface) of the heat conduction member 13 being attached to and in contact with a heat generation component (not shown) in a corresponding electronic equipment (such as a mobile device, a personal computer, a server, a communication chassis or other system or device) for absorbing the heat of the heat generation component, the heat conduction face 132 serving to receive the heat of the heat absorption face 131 and transfer the heat to the lower plate 102 of the plate body 10 to dissipate the heat, in another embodiment, the upper and lower plates 101, 102 (the plate body 10) and the heat conduction member 13 being alternatively made of the same ceramic material (such as silicon nitride ($Si_3N_4$), Zirconia ($ZrO_2$) or alumina ($Al_2O_3$)), for example, the upper and lower plates 101, 102 being made of silicon nitride and the heat conduction member 13 being also made of silicon nitride;

S3. integrally connecting the upper surface of the at least one heat conduction member with the outer surface of the lower plate of the plate body when the upper and lower plates in the lower mold section are thermally pressed and connected with each other to form the plate body by means of the upper and lower mold sections, when the upper and lower plates 101, 102 in the lower mold section 22 are thermally pressed and connected with each other to form the plate body 10 by means of the upper and lower mold sections 21, 22, the upper surface (the heat conduction face 132) of the heat conduction member 13 being integrally connected with an outer surface of the plate body 10 (the outer surface of the lower plate 102) to form the heat dissipation unit 1, in this embodiment, the plate body 10 being a vapor chamber having a chamber 103, a working liquid (such as pure water) being filled in the chamber 103, the capillary structure 105 being disposed in the chamber 103, in practice, the plate body 10 being alternatively a heat plate, the outer surface of the lower plate 102 of the plate body 10 having at least one connection section 1021, in this embodiment, the at least one connection section 1021 being one connection section 1021 corresponding to one heat conduction member 13, for example, a connection section 1021 of the outer surface of the lower plate 102 facing and being integrally connected with the heat conduction face 132 of the heat conduction member 13 to form the heat dissipation unit 1, in this embodiment, the number of the connection section 1021 and the number of the heat conduction member 13 being not limited to one, in a modified embodiment, more than two connection sections 1021 corresponding to more than two heat conduction members 13, in other words, the number of the connection section 1021 being equal to the number of the heat conduction member 13, also, the height (or thickness) of the heat conduction member 13 being adapted to the heat generation component so that the heat conduction member 13 can directly contact and attach to the heat generation component, for example, as shown in FIG. 3, two connection sections 1021 being correspondingly connected with two heat conduction members with different heights, which respectively directly contact two heat generation components with different heights, whereby the heat conduction members can effectively conduct and dissipate the heat of the heat generation components lower than the peripheral or adjacent electronic components or multiple heat generation components with different heights; and S4. filling a working liquid into an opening of the plate body and vacuuming the plate body and sealing the opening of the plate body, a working liquid being filled into an opening (not shown) of the plate body 10, then the plate body 10 being vacuumed and then the opening of the plate body 10 being sealed, whereby the chamber 103 of the plate body 10 is in a vacuumed state for the working liquid to vapor-liquid circulate within the chamber 103.

According to the design of the manufacturing method of heat dissipation unit of the present invention, the capillary structure 105 and the upper and lower plates 101, 102 and the heat conduction member 13 made of the same material can be processed and connected to form the heat dissipation unit 1 at one time, (that is, the upper and lower plates 101, 102, the capillary structure 105 and the heat conduction member 13 can be integrally connected with each other to form the heat dissipation unit 1 at one time). Therefore, the manufacturing process is simplified and the entire manufacturing speed is increased. Also, the manufacturing cost is effectively lowered. In addition, the upper and lower plates 101, 102 and the heat conduction member 13 are respectively securely received in the receiving depression 221 and the sink 2211 of the lower mold section 22 of the mold 2, whereby the heat conduction face 132 of the heat conduction member 13 can be precisely connected under the connection section 1021 of the lower plate 102 of the plate body 10. Therefore, the heat conduction member 13 can be precisely connected under the outer surface of the lower plate 102 in alignment with the internal chamber 103 to achieve better heat dissipation efficiency. Moreover, the connection section 1021 of the lower plate 102 of the plate body 10 is precisely aligned with the heat generation component in the electronic equipment, the heat of which needs to be dissipated. Therefore, by means of the method of the present invention, the heat conduction face 132 of the heat conduction member 13 can be fully precisely connected under the connection section 1021 of the lower plate 102 without displacement. In this case, the entire heat absorption face 131 of the heat conduction member 13, (that is, the lower surface of the heat conduction member 13), can fully snugly attach to and directly contact the entire surface of the heat generation component to effectively enhance the heat conduction efficiency.

Figure 4A:
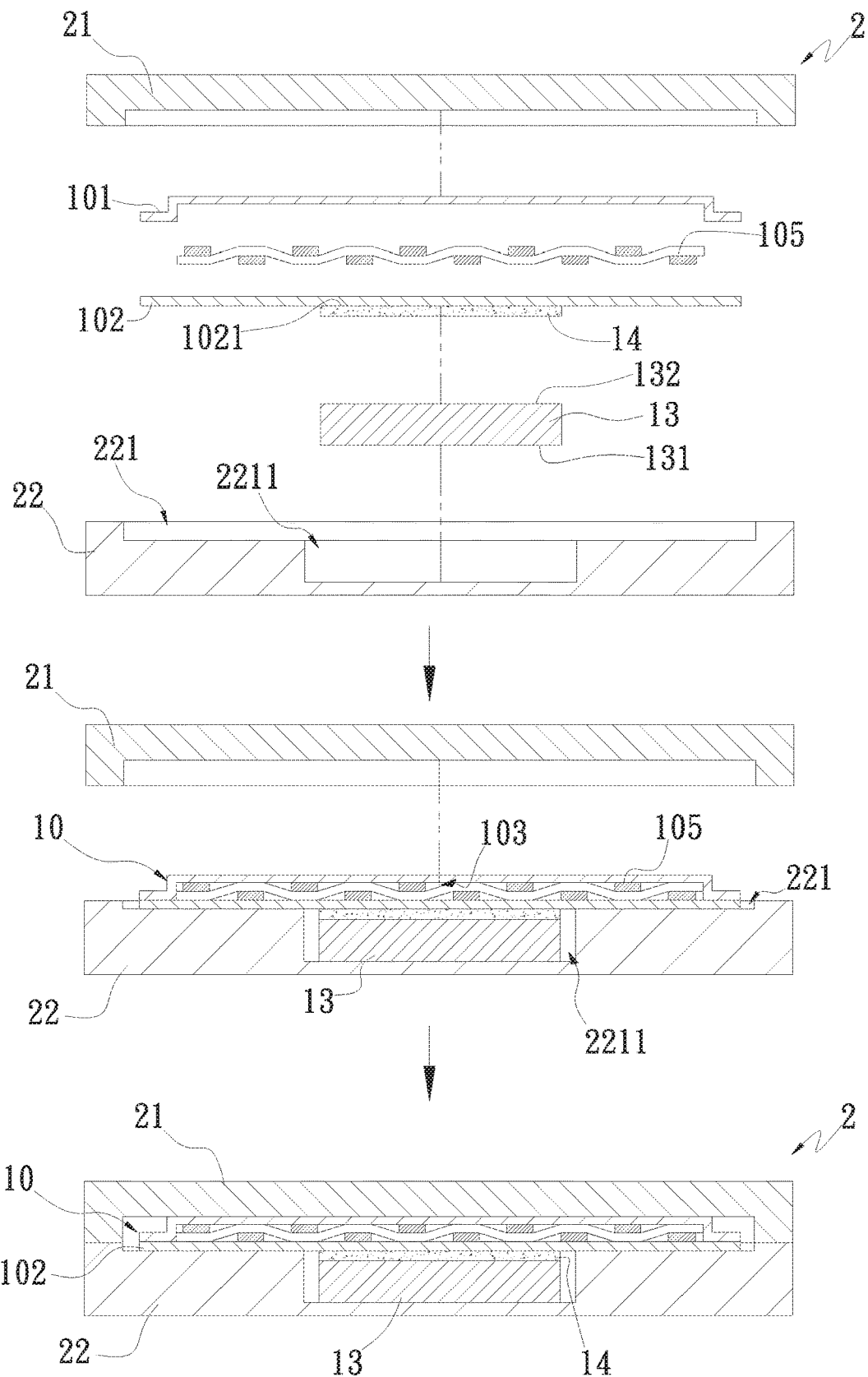
FIG. 4A is a sectional view showing the second embodiment of the manufacturing method of heat dissipation unit of the present invention.
Figure 4B:
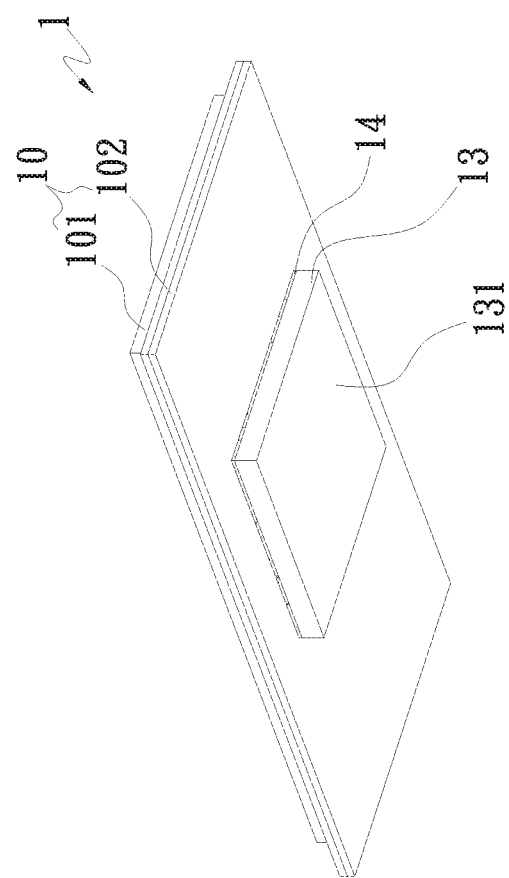
FIG. 4B is a perspective view of another heat dissipation unit of the present invention.

Please refer to FIGS. 4, 4A and 4B. FIG. 4 is a flow chart of a second embodiment of the present invention. FIG. 4A is a sectional view showing the second embodiment of the manufacturing method of heat dissipation unit of the present invention. FIG. 4B is a perspective view of another heat dissipation unit of the present invention. The second embodiment is different from the first embodiment in that in the first embodiment of the manufacturing method of heat dissipation unit, the upper and lower plates 101, 102 and the heat conduction member 13 made of the same material and the capillary structure 105 are integrally connected with each other at one time, while in the second embodiment, the upper and lower plates 101, 102 and at least one heat conduction member 13 made of different materials and the capillary structure 105 are integrally connected with each other to form the heat dissipation unit 1 at one time. The second embodiment also includes steps S1 to S4, wherein steps S1 and S4 are identical to steps S1 and S4 of the first embodiment and thus will not be redundantly described hereinafter. Step S2 of the second embodiment is different from step S2 of the first embodiment in that step S2 of the second embodiment is providing an upper plate, a lower plate, a capillary structure and at least one heat conduction member. The at least one heat conduction member is positioned in the at least one sink. The lower plate, the capillary structure and the upper plate are sequentially positioned in the receiving depression of the lower mold section. Then the at least one heat conduction member, the lower plate, the capillary structure and the upper plate are thermally pressed and connected with each other by means of the upper and lower mold sections. The difference between the first and second embodiments is that the upper and lower plates 101, 102 and the heat conduction member 13 are made of different materials and at least one connection medium layer 14 is connected between the lower plate 102 and the heat conduction member 13. The different materials can be different metal materials (such as copper, aluminum, stainless steel or titanium) or different ceramic materials (such as silicon nitride ($Si_3N_4$), Zirconia ($ZrO_2$) or alumina ($Al_2O_3$)). In this embodiment, the upper and lower plates 101, 102 (the plate body 10) are made of titanium, while the heat conduction member 13 is made of copper for illustration purposes. The partial structure and connection relationship of the upper and lower plates 101, 102 and the capillary structure 105 disposed between the upper and lower plates 101, 102 and the heat conduction member 13 are identical to that of the first embodiment and thus will not be repeatedly described hereinafter.

The at least one connection medium layer 14 is formed under the outer surface of the lower plate 102 by means of evaporation, sputtering or electroplating. The at least one connection medium layer 14 is a nickel coating layer, a tin coating layer or a copper coating layer. In this embodiment, the at least one connection medium layer 14 is one connection medium layer 14 such as a copper coating layer formed under the connection section 1021 of the outer surface of the lower plate by means of sputtering for illustration purposes. The heat conduction member 13 is placed in the sink 2211 and the lower plate 102 formed with the connection medium layer 14, the capillary structure 105 and the upper plate 101 are sequentially placed in the receiving depression 221 of the lower mold section 22 of the mold 2. At this time, the connection medium layer 14 is positioned between the outer surface of the lower plate 102 and the upper surface (the heat conduction face 132) of the heat conduction member 13. Then the upper and lower plates 101, 102, the heat conduction member 13 and the capillary structure 105 are thermally pressed and connected with each other by means of the upper and lower mold sections 21, 22. In a modified embodiment, the connection medium layer 14 is alternatively a nickel coating layer (or a tin coating layer) formed under the connection section 1021 of the outer surface of the plate body 10 by means of evaporation or electroplating.

In another embodiment, the upper and lower plates 101, 102 (the plate body 10) and the heat conduction member 13 are alternatively made of different ceramic materials (such as silicon nitride ($Si_3N_4$), Zirconia ($ZrO_2$) or alumina ($Al_2O_3$)). For example, the upper and lower plates 101, 102 (the plate body 10) is made of silicon nitride, while the heat conduction member 13 is made of alumina. In a modified embodiment, the upper and lower plates 101, 102 and the heat conduction member 13 are alternatively made of different metal materials and ceramic materials. For example, the upper and lower plates 101, 102 are made of alumina ($Al_2O_3$), while the heat conduction member 13 is made of copper.

Step S3 of the second embodiment is different from step S3 of the first embodiment in that step S3 of the second embodiment is integrally connecting the upper surface of the at least one heat conduction member with the outer surface of the lower plate of the plate body when the upper and lower plates in the lower mold section are thermally pressed and connected with each other to form the plate body by means of the upper and lower mold sections. The difference between the first and second embodiments is that when the upper and lower plates 101, 102 in the lower mold section 22 are thermally pressed and connected with each other to form the plate body 10 by means of the upper and lower mold sections 21, 22, the connection medium layer 14 under the outer surface of the lower plate 102 of the plate body 10 faces and is integrally connected with the upper surface (the heat conduction face 132) of the heat conduction member 13. In this embodiment, the connection medium layer 14 formed under the connection section 1021 of the outer surface of the lower plate 102 faces and is connected with the heat conduction face 132 of the heat conduction member 13 to form the heat dissipation unit 1. In a modified embodiment, in steps S2 and S3, the connection medium layer 14 is alternatively formed on the heat conduction face 132 of the heat conduction member 13 by means of evaporation, sputtering or electroplating. The at least one heat conduction member 13 formed with the connection medium layer 14 is placed in the at least one sink 2211 and the lower plate 102, the capillary structure 105 and the upper plate 101 are sequentially placed in the receiving depression 221 of the lower mold section 22. The at least one connection medium layer 14 is positioned between the upper surface of the at least one heat conduction member 13 and the outer surface of the plate body 10. Then the heat conduction member 13, the lower plate 102, the capillary structure 105 and the upper plate 101 are thermally pressed and connected with each other by means of the upper and lower mold sections 21, 22 (as in step S2), whereby the connection medium layer 14 on the heat conduction face 132 (the upper surface) of the heat conduction member 13 faces and is integrally connected with the outer surface of the lower plate 102 (as in step S3).

According to the above arrangement of the manufacturing method of heat dissipation unit of the present invention, the connection medium layer 14 is formed under the outer surface of the plate body 10 to face the heat conduction face 132 of the heat conduction member 13 placed in the mold 2. Then the capillary structure and the upper and lower plates and the heat conduction member 13 made of different materials as well as the connection medium layer 14 are together thermally pressed and connected to form the heat dissipation unit 1 at one time, (that is, the upper and lower plates, the capillary structure, the connection medium layer 14 and the heat conduction member 13 are integrally connected with each other to form the heat dissipation unit 1 at one time). Therefore, the manufacturing process is simplified and the entire manufacturing speed is increased. Also, the manufacturing cost is effectively lowered. In addition, better heat conduction efficiency and better heat dissipation effect can be achieved.

Figure 5A:
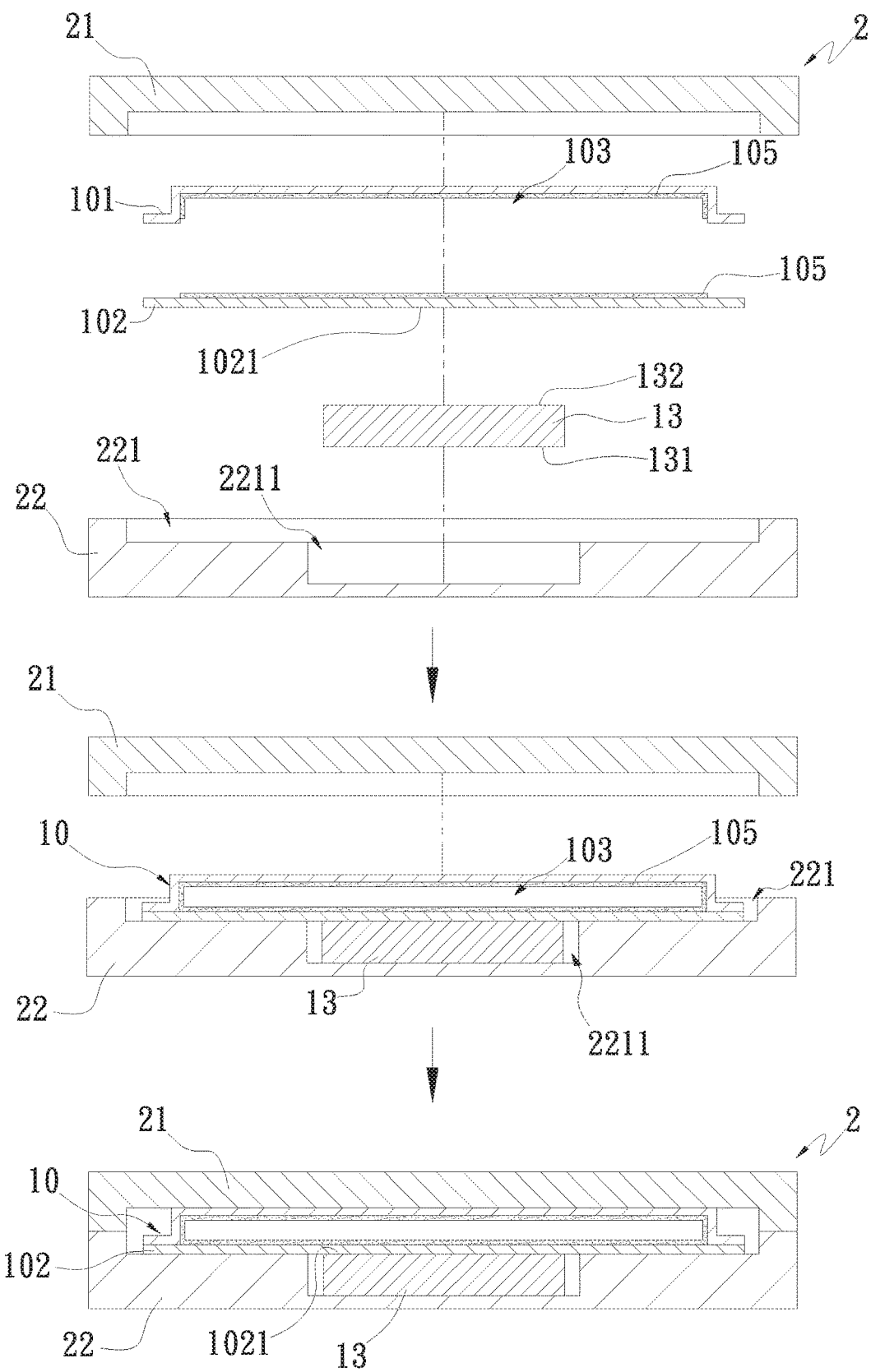
FIG. 5A is a sectional view showing the third embodiment of the manufacturing method of heat dissipation unit of the present invention.

Please refer to FIGS. 5 and 5A. FIG. 5 is a flow chart of a third embodiment of the present invention. FIG. 5A is a sectional view showing the third embodiment of the manufacturing method of heat dissipation unit of the present invention. Also referring to FIG. 2, the third embodiment is different from the first embodiment in that in the first embodiment, the capillary structure 105 is a separate component placed between the upper and lower plates 101, 102, while in the third embodiment, the capillary structure 105 is directly previously formed on the inner side of at least one or both of the upper and lower plates 101, 102. That is, in this embodiment, the upper plate 101 formed with a capillary structure 105 and/or the lower plate 102 formed with another capillary structure 105 and the heat conduction member 13 made of the same material are integrally connected with each other to form the heat dissipation unit 1 at one time. The structure and connection relationship of the mold 2 (including the upper and lower mold sections 21, 22) of step S1 of the third embodiment are identical to the structure and connection relationship of the mold 2 (including the upper and lower mold sections 21, 22) of step S1 of the first embodiment and thus will not be repeatedly described hereinafter.

Step S2 of the third embodiment is partially identical to step S2 of the first embodiment and thus will not be repeatedly specifically described hereinafter. Step S2 of the third embodiment is different from step S2 of the first embodiment in that step S2 of the third embodiment is providing an upper plate, a lower plate, a capillary structure formed on the inner side of at least one or both of the upper and lower plates and at least one heat conduction member. The material, structure and connection relationship of the upper and lower plates 101, 102 and the heat conduction member 13 are identical to that of the first embodiment. In this embodiment, a capillary structure 105 is previously formed on the inner side of the upper plate 101 and another capillary structure 105 is previously formed on the inner side of the lower plate 102. The capillary structure 105 and the another capillary structure 105 are sintered powder bodies respectively formed on the inner sides of the upper and lower plates 101, 102 by means of sintering. Then the at least one heat conduction member 13 is placed in the at least one sink 2211 and the lower plate 102 formed with the other capillary structure 105 on the inner side and the upper plate 101 formed with the capillary structure 105 on the inner side are sequentially placed in the receiving depression 221 of the lower mold section 22. Then the upper and lower plates 101, 102 and the heat conduction member 13 are thermally pressed and connected with each other by means of the upper and lower mold sections 21, 22. In a modified embodiment, the capillary structure 105 is alternatively a channeled body, a combination of channeled body and whisker or a combination of sintered powder body and whisker.

Steps S3 and S4 of the third embodiment are identical to steps S3 and S4 of the first embodiment and thus will not be repeatedly described hereinafter.

Figure 6A:
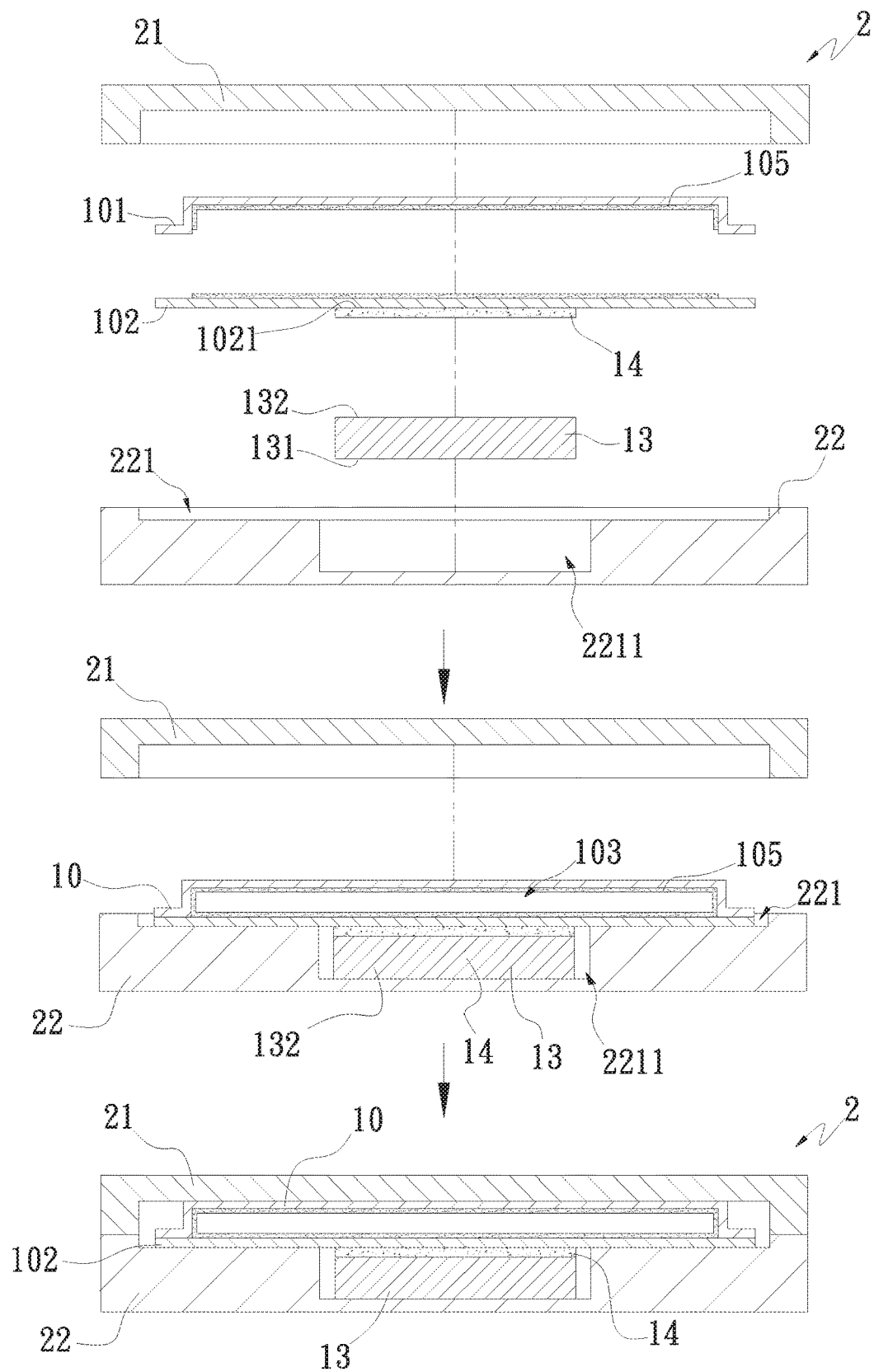
FIG. 6A is a sectional view showing the fourth embodiment of the manufacturing method of heat dissipation unit of the present invention.

Please refer to FIGS. 6 and 6A. FIG. 6 is a flow chart of a fourth embodiment of the present invention. FIG. 6A is a sectional view showing the fourth embodiment of the manufacturing method of heat dissipation unit of the present invention. Also referring to FIG. 4B, the fourth embodiment is different from the second embodiment in that in the second embodiment, the capillary structure 105 is a separate component placed between the upper and lower plates 101, 102, while in the fourth embodiment, the capillary structure 105 is directly previously formed on the inner side of at least one or both of the upper and lower plates 101, 102. That is, in this embodiment, the upper plate 101 formed with a capillary structure 105 and/or the lower plate 102 formed with another capillary structure 105 and the heat conduction member 13 are made of different materials and are integrally connected with each other via the connection medium layer 14 to form the heat dissipation unit 1 at one time. The structure and connection relationship of the mold 2 (including the upper and lower mold sections 21, 22) of step S1 of the fourth embodiment are identical to the structure and connection relationship of the mold 2 (including the upper and lower mold sections 21, 22) of step S1 of the second embodiment and thus will not be repeatedly described hereinafter.

Step S2 of the fourth embodiment is partially identical to step S2 of the second embodiment and thus will not be repeatedly specifically described hereinafter. Step S2 of the fourth embodiment is different from step S2 of the second embodiment in that step S2 of the fourth embodiment is providing an upper plate, a lower plate, a capillary structure formed on the inner side of at least one or both of the upper and lower plates and at least one heat conduction member and at least one connection medium layer.

Then the heat conduction member 13 is placed in the sink 2211 and the lower plate 102 formed with the other capillary structure 105 on the inner side and formed with the connection medium layer 14 on the outer surface and the upper plate 101 formed with the capillary structure 105 on the inner side are sequentially placed in the receiving depression 221 of the lower mold section 22. The connection medium layer 14 is positioned between the outer surface of the plate body 10 and the upper surface of the heat conduction member 13. Then the upper and lower plates 101, 102, the heat conduction member 13 are thermally pressed and connected with each other by means of the upper and lower mold sections 21, 22. The structure and connection relationship of the capillary structure 105 of the fourth embodiment are identical to the structure and connection relationship of the capillary structure 105 of the third embodiment.

Steps S3 and S4 of the fourth embodiment are identical to steps S3 and S4 of the second embodiment and thus will not be repeatedly described hereinafter.

According to the design of the manufacturing method of heat dissipation unit of the present invention, the heat dissipation unit can be processed at one time. Therefore, the manufacturing process is simplified and the manufacturing cost is effectively lowered. Also, the entire manufacturing speed is increased.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A manufacturing method of heat dissipation unit, comprising steps of:
providing a mold having an upper mold section and a lower mold section, the lower mold section being formed with a receiving depression, a bottom side of the receiving depression being sunken to form at least one sink;
providing an upper plate, a lower plate, a capillary structure and at least one heat conduction member, the at least one heat conduction member being positioned in the at least one sink, the lower plate, the capillary structure and the upper plate being sequentially positioned in the receiving depression of the lower mold section, then the at least one heat conduction member, the lower plate, the capillary structure and the upper plate being thermally pressed and connected with each other by means of the upper and lower mold sections; and
integrally connecting the upper surface of the at least one heat conduction member with the outer surface of the lower plate of the plate body when the upper and lower plates in the lower mold section are thermally pressed and connected with each other to form the plate body by means of the upper and lower mold sections.

2. The manufacturing method of heat dissipation unit as claimed in claim 1, wherein the at least one heat conduction member has a heat absorption face and a heat conduction face, the heat conduction face being the upper surface of the at least one heat conduction member, the heat absorption face being a lower surface of the at least one heat conduction member.

3. The manufacturing method of heat dissipation unit as claimed in claim 2, wherein the plate body has a chamber, a working liquid being filled in the chamber, the outer surface of the lower plate having at least one connection section, the at least one connection section facing and being connected with the heat conduction face of the at least one heat conduction member.

4. The manufacturing method of heat dissipation unit as claimed in claim 1, wherein in the step of providing an upper plate, a lower plate, a capillary structure and at least one heat conduction member, the at least one heat conduction member being positioned in the at least one sink, the lower plate, the capillary structure and the upper plate being sequentially positioned in the receiving depression of the lower mold section, then the at least one heat conduction member, the lower plate, the capillary structure and the upper plate being thermally pressed and connected with each other by means of the upper and lower mold sections, at least one connection medium layer is provided, the at least one connection medium layer being formed under the outer surface of the lower plate by means of evaporation, sputtering or electroplating, the at least one heat conduction member being positioned in the at least one sink, the lower plate formed with the at least one connection medium layer, the capillary structure and the upper plate being sequentially positioned in the receiving depression of the lower mold section, the at least one connection medium layer being positioned between the outer surface of the plate body and the upper surface of the at least one heat conduction member, then the at least one heat conduction member, the lower plate formed with the at least one connection medium layer, the capillary structure and the upper plate being thermally pressed and connected with each other by means of the upper and lower mold sections.

5. The manufacturing method of heat dissipation unit as claimed in claim 4, wherein in the step of integrally connecting the upper surface of the at least one heat conduction member with the outer surface of the lower plate of the plate body when the upper and lower plates and in the lower mold section are thermally pressed and connected with each other to form the plate body by means of the upper and lower mold sections, the at least one connection medium layer formed under the outer surface of the lower plate of the plate body faces and is integrally connected with the upper surface of the at least one heat conduction member.

6. The manufacturing method of heat dissipation unit as claimed in claim 1, wherein in the step of providing an upper plate, a lower plate, a capillary structure and at least one heat conduction member, the at least one heat conduction member being positioned in the at least one sink, the lower plate, the capillary structure and the upper plate being sequentially positioned in the receiving depression of the lower mold section, then the at least one heat conduction member, the lower plate, the capillary structure and the upper plate being thermally pressed and connected with each other by means of the upper and lower mold sections, at least one connection medium layer is provided, the at least one connection medium layer being formed on an upper surface of the at least one heat conduction member by means of evaporation, sputtering or electroplating, the at least one heat conduction member formed with the at least one connection medium layer being positioned in the at least one sink, the lower plate, the capillary structure and the upper plate being sequentially positioned in the receiving depression of the lower mold section, the at least one connection medium layer being positioned between the upper surface of the at least one heat conduction member and the outer surface of the plate body, then the at least one heat conduction member with the at least one connection medium layer, the lower plat, the capillary structure and the upper plate being thermally pressed and connected with each other by means of the upper and lower mold sections.

7. The manufacturing method of heat dissipation unit as claimed in claim 6, wherein in the step of integrally connecting the upper surface of the at least one heat conduction member with the outer surface of the lower plate of the plate body when the upper and lower plates and in the lower mold section are thermally pressed and connected with each other to form the plate body by means of the upper and lower mold sections, the at least one connection medium layer formed on the upper surface of the at least one heat conduction member faces and is integrally connected with the outer surface of the lower plate of the plate body.

8. The manufacturing method of heat dissipation unit as claimed in claim 1, further comprising a step of filling a working liquid into an opening of the plate body and vacuuming the plate body and sealing the opening of the plate body after the step of integrally connecting the upper surface of the at least one heat conduction member with the outer surface of the lower plate of the plate body when the upper and lower plates and the capillary structure in the lower mold section are thermally pressed and connected with each other to form the plate body by means of the upper and lower mold sections.

9. The manufacturing method of heat dissipation unit as claimed in claim 1, wherein the at least one connection medium layer is a nickel coating layer, a tin coating layer or a copper coating layer.

10. The manufacturing method of heat dissipation unit as claimed in claim 1, wherein the plate body and the at least one heat conduction member are made of different materials.

11. The manufacturing method of heat dissipation unit as claimed in claim 1, wherein the plate body and the at least one heat conduction member are made of metal or ceramic materials, the metal material being selected from a group consisting of copper, aluminum, stainless steel and titanium, the ceramic material being selected from a group consisting of silicon nitride ($Si_3N_4$), Zirconia ($ZrO_2$) and alumina ($Al_2O_3$).

12. The manufacturing method of heat dissipation unit as claimed in claim 1, wherein the mold is a graphite mold.

13. The manufacturing method of heat dissipation unit as claimed in claim 1, wherein the plate body is a vapor chamber or a heat plate.

14. The manufacturing method of heat dissipation unit as claimed in claim 1, wherein the capillary structure is a woven mesh or fiber body.

15. A manufacturing method of heat dissipation unit, comprising steps of:
    providing a mold having an upper mold section and a lower mold section, the lower mold section being formed with a receiving depression, a bottom side of the receiving depression being sunken to form at least one sink;
    providing an upper plate, a lower plate, a capillary structure formed on inner side of at least one or both of the upper and lower plates and at least one heat conduction member, the at least one heat conduction member being positioned in the at least one sink, the lower plate and the upper plate being sequentially positioned in the receiving depression of the lower mold section, then the at least one heat conduction member, the lower plate and the upper plate being thermally pressed and connected with each other by means of the upper and lower mold sections; and
    integrally connecting the upper surface of the at least one heat conduction member with the outer surface of the lower plate of the plate body when the upper and lower plates in the lower mold section are thermally pressed and connected with each other to form the plate body by means of the upper and lower mold sections.

16. The manufacturing method of heat dissipation unit as claimed in claim 15, wherein in the step of providing an upper plate, a lower plate, a capillary structure formed on inner side of at least one or both of the upper and lower plates and at least one heat conduction member, the at least one heat conduction member being positioned in the at least one sink, the lower plate and the upper plate being sequentially positioned in the receiving depression of the lower mold section, then the at least one heat conduction member, the lower plate and the upper plate being thermally pressed and connected with each other by means of the upper and lower mold sections, at least one connection medium layer is provided, the at least one connection medium layer being formed under the outer surface of the lower plate by means of evaporation, sputtering or electroplating, the at least one heat conduction member being positioned in the at least one sink, the lower plate formed with the at least one connection medium layer and the upper plate being sequentially positioned in the receiving depression of the lower mold section, the at least one connection medium layer being positioned between the outer surface of the plate body and the upper surface of the at least one heat conduction member, then the at least one heat conduction member, the lower plate formed with the at least one connection medium layer and the upper plate being thermally pressed and connected with each other by means of the upper and lower mold sections.

17. The manufacturing method of heat dissipation unit as claimed in claim 16, wherein in the step of integrally connecting the upper surface of the at least one heat conduction member with the outer surface of the lower plate of the plate body when the upper and lower plates and in the lower mold section are thermally pressed and connected with each other to form the plate body by means of the upper and lower mold sections, the at least one connection medium layer formed under the outer surface of the lower plate of the plate body faces and is integrally connected with the upper surface of the at least one heat conduction member.

18. The manufacturing method of heat dissipation unit as claimed in claim 15, further comprising a step of filling a working liquid into an opening of the plate body and vacuuming the plate body and sealing the opening of the plate body to form the heat dissipation unit after the step of integrally connecting the upper surface of the at least one heat conduction member with the outer surface of the lower plate of the plate body when the upper and lower plates and the capillary structure in the lower mold section are thermally pressed and connected with each other to form the plate body by means of the upper and lower mold sections.

19. The manufacturing method of heat dissipation unit as claimed in claim 15, wherein the at least one heat conduction member has a heat absorption face and a heat conduction face, the heat conduction face being the upper surface of the at least one heat conduction member, the heat absorption face being a lower surface of the at least one heat conduction member, the plate body having a chamber, a working liquid being filled in the chamber, the outer surface of the lower plate having at least one connection section, the at least one connection section facing and being connected with the heat conduction face of the at least one heat conduction member.

20. The manufacturing method of heat dissipation unit as claimed in claim 15, wherein the at least one connection medium layer is a nickel coating layer, a tin coating layer or a copper coating layer.

21. The manufacturing method of heat dissipation unit as claimed in claim 15, wherein the plate body and the at least one heat conduction member are made of different materials.

22. The manufacturing method of heat dissipation unit as claimed in claim 15, wherein the plate body and the at least one heat conduction member are made of metal or ceramic materials, the metal material being selected from a group consisting of copper, aluminum, stainless steel and titanium, the ceramic material being selected from a group consisting of silicon nitride ($Si_3N_4$), Zirconia ($ZrO_2$) and alumina ($Al_2O_3$).

23. The manufacturing method of heat dissipation unit as claimed in claim 15, wherein the mold is a graphite mold.

24. The manufacturing method of heat dissipation unit as claimed in claim 15, wherein the plate body is a vapor chamber or a heat plate.

25. The manufacturing method of heat dissipation unit as claimed in claim 15, wherein the capillary structure is a sintered powder body or a channeled body or a combination of sintered powder body and whisker or a combination of channeled body and whisker.

* * * * *